United States Patent [19]

Hieber et al.

[11] Patent Number: 5,399,389
[45] Date of Patent: Mar. 21, 1995

[54] METHOD FOR LOCALLY AND GLOBALLY PLANARIZING CHEMICAL VAPOR DEPOSITION OF SIO$_2$ LAYERS ONTO STRUCTURED SILICON SUBSTRATES

[75] Inventors: Konrad Hieber, Neukeferloh; Jasper Von Tomkewitsch, Ottobrunn; Oswald Spindler, Vaterstetten, all of Germany; Helmuth Treichel, South Burlington, Vt.; Zvonimir Gabric, Zorneding; Alexander Gschwandtner, Muenchen, both of Germany

[73] Assignee: Siemens Aktiengesellschaft, Munich, Germany

[21] Appl. No.: 94,337

[22] Filed: Jul. 20, 1993

[30] Foreign Application Priority Data

Aug. 4, 1992 [EP] European Pat. Off. .......... 92113281

[51] Int. Cl.$^6$ .......................... B05D 3/06; H01L 21/02
[52] U.S. Cl. ...................... 427/579; 427/578; 427/533; 427/255.7; 427/419.2; 156/643; 156/653; 437/195; 437/228; 437/238; 437/978
[58] Field of Search ............. 427/579, 578, 255.7, 427/419.2, 419.3, 533; 437/228, 238, 195, 978; 156/643, 653

[56] References Cited

U.S. PATENT DOCUMENTS

| | | | |
|---|---|---|---|
| 4,614,021 | 9/1986 | Hulseweh . | |
| 4,789,648 | 12/1988 | Chow et al. | 437/225 |
| 4,872,947 | 10/1989 | Wang et al. | 437/235 |
| 4,962,064 | 10/1990 | Haskell et al. | 437/228 |
| 5,231,058 | 7/1993 | Maeda et al. | 437/235 |
| 5,271,972 | 12/1993 | Kwok et al. | 427/579 |

FOREIGN PATENT DOCUMENTS 0171605 2/1986 Germany .
4-107924 4/1992 Japan .

OTHER PUBLICATIONS

T. H. Daubenspeck et al., "Planarization of ULSI Topography over Variable Pattern Densities", J. Electrochem. Soc., vol. 138, No. 2, Feb. 1991, pp. 506–509.

K. Fujino et al., "Reaction Mechanism of TEOS and O$_3$ Atmospheric Pressure CVD", Semiconductor Process Laboratory, Jun. 11–12, 1991, VMIC Conference, pp. 445–447.

D. Widmann et al., "Technologie Hochintegrierter Schaultungen", Springer-Verlag 1988, Section 3.5.5, pp. 78–81.

*Primary Examiner*—Roy V. King
*Attorney, Agent, or Firm*—Hill, Steadman & Simpson

[57] ABSTRACT

In the ozone-activated deposition of insulating layers, different growth rates can be achieved on differently constituted surfaces. When the surfaces of the structured silicon substrates lying at different levels are differently constituted or, respectively, are intentionally varied such that the SiO$_2$ insulating layer grows more slowly on the higher surfaces than on the more deeply disposed surfaces and when deposition is carried out until the surfaces of the rapidly growing and slowly growing layer regions form a step-free, planar level, a local and global planarization is achieved.

15 Claims, 1 Drawing Sheet

METHOD FOR LOCALLY AND GLOBALLY PLANARIZING CHEMICAL VAPOR DEPOSITION OF SIO₂ LAYERS ONTO STRUCTURED SILICON SUBSTRATES

BACKGROUND OF THE INVENTION

The present invention generally relates to a method for locally and globally planarizing chemical vapor deposition (CVD) of $SiO_2$ layers onto structured silicon substrates. More specifically, the invention is related to the deposition of planar $SiO_2$ layers that serve as insulating layers between individual levels of a multi-layer wiring in VLSI semiconductor circuits.

At the end of a manufacturing process of microelectronic circuits, all active and passive circuit elements must be connected to one another with metallic interconnects that are usually composed of aluminum. The interconnects are thereby etched by a dry etching method from a layer that is initially applied surface-wide.

Due to increasingly smaller spacing of the individual elements—down to 0.3 $\mu$m in a 64 Mbit memory generation—as a result of increasingly higher integration and further due to the necessity of connecting the elements to one another independently of their position on the semiconductor circuit, a wiring which is arranged in a plurality of levels wherein each level is above one another is being increasingly selected, particularly in logic chips. Due to this arrangement, however, the wiring levels must be separated from one another by introducing insulating layers therebetween, also referred to as dielectric interlayers.

As a consequence of the increasing complexity, the surface of each and every wiring level before the application of the insulating layers becomes increasingly more similar to a pronounced "mountain range". As a result, considerable problems arise in the deposition of the insulating layers and also in the following lithography (producing via holes). Planarization processes are, therefore, utilized in order to compensate for irregularities caused by the structures therebelow based on the $SiO_2$ layer.

Two fundamental problem areas typically arise from planarization processes. First, as is generally known, every enhancement of the resolution required during the course of miniaturization is accompanied by a decreasing depth of field. A low depth of field causes problems at the very outset in submicrometer lithography. The depth of field, however, is further reduced by factors such as the irregularity of the wafer surface itself which arises to a substantial degree in multi-layer wiring. Height differences must, therefore, be completely compensated which arise due to the structuring of the metallization levels to the farthest-reaching extent, i.e. to achieve an optimally high degree of planarization.

Second, as a consequence of the arbitrary electrical contacting of the components to one another, interconnect spacings from the submicrometer range up to the millimeter range occur in the individual wiring levels. A planarization method that is only locally satisfactory, i.e. in regions less than or equal to 1.5 $\mu$m, is inadequate given a spacing between two raised structures becoming greater than or equal to 20 $\mu$m. The tendency increases when $SiO_2$ deposited thereabove—as well as photoresist layers—do not completely cover this broad range. This increasing tendency, of course, results in a reduced degree of global planarization.

Consequently, difficulties arise during planarization of a dielectric. On the one hand, extremely small interconnect spacings must be filled to be free of voids such that interconnects leading thereover are not interrupted. Even given large interconnect spacings, height differences must, as well, be compensated for in a satisfactory manner in order to enable lithography for submicrometer interconnects for the wiring plane leading thereover.

D. Wiedmann et al., "Technologie Hochintegrierter Schaltungen", Springer-Verlag, 1988, Section 3.5.5, discloses, in general, planarization technology. Employment of a photoresist as a planarizing auxiliary layer is disclosed by Wiedmann et al. wherein a planar surface of the resist is transferred onto a $SiO_2$ layer in a re-etching technique in an ideal case. Given standard layer thicknesses of the resist of approximately 2 $\mu$m, the range of the photoresist planarization lies in the 10 $\mu$m region. As a result, the undesired lowering again occurs given greater spacings between the raised structures. The global degree of planarization is also deteriorated. A method for planarization with spin-on glass (SOG) is, likewise, generally disclosed in Wiedmann et al. The planarization degree that can be achieved is comparable to that of photoresist.

More recent planarization methods that, for example, particularly employ low-viscosity lacquers or a chemical mechanical polishing (CMP) method are also less satisfactory especially during a switch to greater spacings of, for example, a few 100 $\mu$m.

The above-described planarization methods are structure-dependent, i.e. spacing-dependent, and, therefore, only have a limited planarization range. An article by T. H. Daubenspeck et al., *J. Electrochem. Sco.*, Vol. 138, No. 2 (1991) also discloses a method for producing completely planarized dielectrics. The method employs what are referred to as dummy structures for filling out extensive regions not covered by the metallization. The dummy structures have the same thickness as the metallization. In the known method, local level fluctuations that arise due to the etching of the dummy structures must be subsequently either planarized by photoresist or must be compensated by chemical-mechanical polishing. The artificial aluminum structures not actually used proceeding from the circuit also have the disadvantage that coupling capacitances arise. Over and above this, the method involves extremely great outlay and is generally only suitable for chips having regular structures.

The conceivable possibility of achieving planarization by employing a highly surface-controlled coating process is successful only by filling narrow structures, such as trenches and blind holes.

From the selection of the metallization material, such as aluminum or copper, the temperature range of the deposition process or, respectively, planarization process is limited to less than 450° C. Traditional CVD deposition of a $SiO_2$ layer with TEOS (tetra-ethyl-ortho-silicate) as an initial substance or precursor at approximately 700° C. must, therefore, be modified. Since plasma-enhanced oxide layers are not considered due to their only average conformity, CVD methods have been developed wherein the deposition temperature is lowered by adding ozone. Since decomposition and chemical attack of the ozone occurs at the substrate surface, one also succeeds in filling up metallization gaps of less than 0.3 $\mu$m width void-free with TEOS as the precursor in chemical vapor depositions implemented with atmospheric pressure. This process along with SOG planarization, which is limited given a minimum gap width of 0.8 μm, are the only methods that can fill narrow gaps with spacings far down into the submicrometer range void-free and with a good, local degree of planarization. The planarization range, however, again amounts to only a few μm.

Over and above this, in view of the general utility of ozone-activated chemical vapor deposition of SiO₂ layers (see K. Fujino, Y. Nishimoto, N. Tokumasu and K. Maeda, VMIC Conf. Proc. 445, 1991), problems arise with the conformity and the surface quality due to the identified dependency of the deposition mechanism on the surface quality of the substrate. In addition, Fujino et al. found that higher deposition rates arise on Si than on thermal SiO₂ given employment of TEOS and, to an even greater degree, given the compounds OMTC (octa-methyl-cyclo-tetra-siloxane) and HMDS (hexa-methyl-disiloxane) given high ozone concentrations (approximately 5%). In order to overcome the disturbing dependency on the surface quality, Fujino et al. propose a plasma treatment of the surfaces composed of thermal SiO₂ in order to improve their surface quality and in order to increase the deposition rate on the modified layer and match it to that of Si.

SUMMARY OF THE INVENTION

The present invention specifies a method of which is improved with respect to the noted disadvantages of the prior methods. On the one hand, the method provides a void-free filling of gaps smaller than 0.3 μm and, on the other hand, simultaneously assures a high global degree of planarization given spacings between the raised structures up to the millimeter range.

To this end, a method is provided for locally and globally planarizing chemical vapor deposition of SiO₂ layers onto structured silicon substrates. The method comprises the steps of providing precursors having different growth rates for SiO₂ on differently constituted surfaces wherein the deposition proceeds by ozone activation and wherein the surfaces are a different level such that an SiO₂ layer grows more slowly on higher surfaces than on more deeply disposed surfaces. The method further comprises a step of continuing deposition until the surfaces of the rapidly growing layer and of the slowly growing layer regions form a step-free planar level.

In an embodiment, the more deeply disposed surfaces of the method of the present invention are composed of phosphorous silicate glass or of borophosphorous silicate glass.

In an embodiment, the method further comprises the step of applying at least one auxiliary layer for varying surface quality. The auxiliary layer, in an embodiment, is a SiO₂ layer deposited on the higher surfaces in a PECVD method.

In an embodiment, the more deeply disposed surfaces are conditioned toward a higher growth rate with a plasma treatment particularly implemented in a nitrogen atmosphere.

In an embodiment, the SiO₂ auxiliary layer deposited with plasma-enhanced chemical vapor deposition (PECVD) is conditioned by plasma treatment.

In an embodiment, the precursors are selected from the compounds TEOS, OMTC or HMDS.

In an embodiment, an isotropic re-etching of the different SiO₂ surfaces is implemented with an etching rate ratio of 1:1 down to a desired level above the higher surfaces following planarization.

In an embodiment, the method further comprises the step of setting thickness of a planar layer structure with an additional layer deposited onto the planar SiO₂ layer.

In an embodiment, the method is performed in a single multi-chamber system isolated from the atmosphere.

In an embodiment, the surfaces lying at different levels in the method of the present invention are formed by interconnects and insulating layers situated between the interconnects.

It is, therefore, an advantage of the present invention to provide a method for void-free filling of gaps including gaps smaller than 0.3 micrometers.

A further advantage of the present invention is to provide a method for void-free filling of gaps smaller than 0.3 micrometers and simultaneously assuring a high global degree of planarization given spacings between the raised structures up to the millimeter range.

Yet another advantage of the present invention is to provide deposition of planar SiO₂ layers which serve as insulating layers between individual levels of a multi-layer wiring in VLSI semiconductor circuits.

Additional features and advantages of the present invention are described in, and will be apparent from, the detailed description of the presently preferred embodiments and from the drawing.

DETAILED DESCRIPTION OF THE PRESENTLY PREFERRED EMBODIMENTS

The present invention generally relates to utilization of different deposition rates on different surfaces in order to form planar surfaces. Among other things, the invention is based on the respectively different deposition rates which in fact arise due to a surface effect, but are nonetheless independent of the layer thickness of the layer already deposited and of the duration of the deposition when the deposition is not interrupted.

A prerequisite for the general, practical applicability of the present invention is the perception that, first, a surface that inherently already exhibits the desired properties (for example, PECVD-PSG or, respectively, PECVD-BPSG) or that is intentionally conditioned to fast layer growth based on plasma treatment comes into consideration as a more deeply disposed starting layer having a faster growth rate. But, on the other hand, the ozone-activated CVD process exhibits a low deposition rate similar to that of thermal oxide or good-quality plasma oxide as well. Because of the high deposition temperature in the present invention, however, this does not come into consideration. A good quality PECVD-SiO₂ layer can thereby be employed as an auxiliary layer on the metallization structures in order to achieve a retarded layer growth thereon.

The planarization method is grid-independent since the insulating layers laterally grow into narrow gaps just as fast as into the wide gaps. This means that the degree of planarization amounts to a constant 100% even given regions occupied with the metallization with various densities.

As a result, an advantage as compared to methods for completely planarizing using dummy structures is that no additional photolithography steps are required and further that equalization of the edges and trenches that arise in the structuring of the dummy structures do not require an additional resist or CMP planarization process. In the method of the invention, narrow gaps are filled with $SiO_2$ in a void-free manner, but preferably proceeding from the floor of the gap. The qualitatively high-grade $SiO_2$ grows rapidly on extensive regions not covered by the metallization in order to ultimately form a locally and globally planarized level together with the layer that is simultaneously slowly growing over the metallization.

In particular, OMTC, HMDS and other silicon-organic compounds that have a high growth difference on the auxiliary layer above the metal in comparison to the starting layer between the metal are suitable as precursors for the chemical vapor deposition, whereby growth differences by a factor of two can be especially well utilized. In the ozone-activated CVD process at atmospheric pressure, the ratio of the deposition rates on silicon to $SiO_2$ given employment of TEOS as a precursor and a high ozone concentration, is approximately 1.5, is approximately three for HMDS and is approximately four for OMTC.

Figure 1:
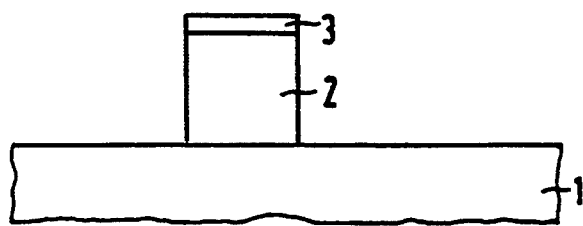
FIG. 1 illustrates a step of the method of the present invention in which a metal interconnect is applied to a first level.

Typical process parameters for the planarizing ozone-activated CVD step are:
OMTC, for example bubbled with $N_2$ (flow) 500–4000 sccm
zone and oxygen flow 2000–10000 sccm
ozone concentration in the oxygen 2–20 weight %
pressure 0.1–3 bar
temperature 300°–500° C.
deposition rate on $SiO_2$ 15–100 nm/min
deposition rate on phosphorus glass (PSG) 50–400 nm/min Referring now to FIG. 1, an aluminum interconnect 2 is illustrated that is built up on a PSG level or a BPSG level 1 and onto which a plasma-enhanced oxide layer was already applied as an auxiliary layer 3.

Figure 2:
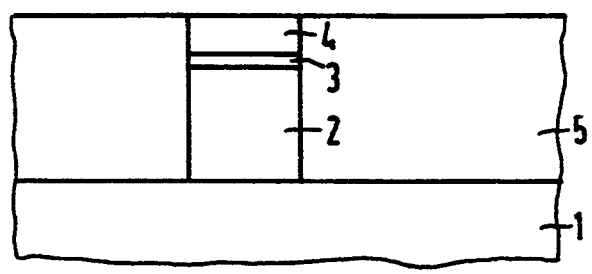
FIG. 2 illustrates a further step of the method of the present invention in which an SiO₂ layer is applied to the first level.

In FIG. 2, wherein identical reference characters designate like parts, a step is shown wherein a good-quality $SiO_2$ layer 5 grows rapidly on the layer 1. The $SiO_2$ layer 5, as shown, has just reached a contiguous, planar level with a simultaneously growing $SiO_2$ layer 4 which, as illustrated, growing more slowly. The goal of a planarizing deposition has thus been initially achieved. That is, the $SiO_2$ layer 4 grows on the auxiliary layer 3 in a less smooth and less uniform manner than the rapidly growing $SiO_2$ layer 5.

The two different, but planar, $SiO_2$ layer regions—over the metal and therebetween—can be subsequently and expediently etched onto the metallization level or, on the other hand, to a portion substantially right above the metallization with an anisotropic re-etching step having an etching selectivity of 1:1 such that only the high-quality $SiO_2$ layer 5 remains between the metallization.

Figure 3:
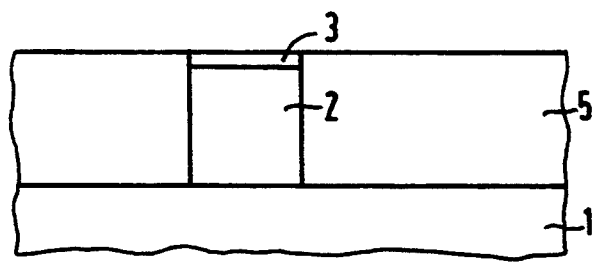
FIG. 3 illustrates a further step of the method of the present invention after an etching process.
Figure 4:
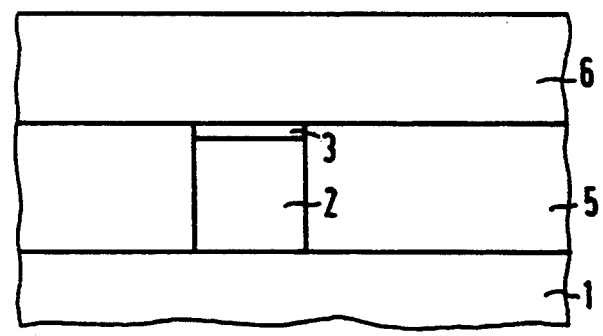
FIG. 4 illustrates a further step of the method of the present invention in which a layer is deposited following the etching step.

Referring now to FIGS. 3 and 4, the still planar surface after the implementation of the additional method step is shown in FIG. 3. FIG. 4 illustrates the possibility of setting the desired, ultimate thickness of a planar layer structure with an additional layer 6 deposited onto the planar $SiO_2$ layer, particularly by PECVD. The re-etching step shown in FIG. 3 can, but need not, ensue previously. When, for example, a phosphosilicate glass (PSG) layer is deposited, then this layer can be employed without additional surface conditioning as a starting layer for the planarizing, ozone-activated chemical vapor deposition of the next metallization level. The individual process steps of the method of the invention can be implemented in a single multi-chamber system that is isolated from the atmosphere.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

We claim as our invention:

1. A method for locally and globally planarizing chemical vapor deposition $SiO_2$ layers onto structured silicon substrates, the method comprising the steps of:
   providing precursors having different growth rates for $SiO_2$ on differently constituted surfaces at different levels;
   conducting deposition on said surfaces by ozone-activated chemical vapor deposition such that an $SiO_2$ layer grows slower in first regions on higher surfaces than in second regions on lower surfaces; and
   planarizing said surfaces by continuing deposition until the surfaces of the first and second regions form a step-free, planar level.

2. The method of claim 1 wherein the lower surfaces are composed of phosphorous silicate glass or of boro-phosphorous silicate glass.

3. The method of claim 1 further comprising the step of:
   applying at least on auxiliary layer on said differently constituted surfaces.

4. The method of claim 3 wherein the step of applying the auxiliary layer comprises depositing a $SiO_2$ layer on the higher surfaces by a PECVD method.

5. The method of claim 1 further comprising the step of:
   conditioning the lower surfaces with a plasma treatment in a nitrogen atmosphere.

6. The method of claim 4 further comprising the step of:
   depositing a $SiO_2$ auxiliary layer on said higher surfaces.

7. The method of claim 1 further comprising the step of:
   selecting the precursors from the group consisting of the compounds TEOS (tetra-ethyl-ortho-silicate), OMTC (octa-methyl-cyclo-tetra-siloxane) and HMDS (hexa-methyl-disiloxane).

8. The method of claim 1 further comprising the step of:
   anisotropically re-etching the different $SiO_2$ surfaces with an etching rate ratio of 1:1 down to a desired level above the higher surfaces following the planarization.

9. The method of claim 8 further comprising the step of:

depositing an additional layer onto the planarized $SiO_2$ layer to form a planar layer structure wherein the thickness of said planar layer structure is set by selectively depositing said additional layer.

10. The method of claim 9 further comprising the step of:

isolating the chemical vapor deposition $SiO_2$ layers from the atmosphere in a single multi-chamber system.

11. The method of claim 1 further comprising the step of:

forming said surfaces lying at different levels by electrical interconnects and insulating layers situated between the interconnects.

12. The method of claim 11 further comprising the step of:

forming an insulating layer between a plurality of wiring levels with the planarized $SiO_2$ layer.

13. The method of claim 11 further comprising the step of:

depositing an additional layer onto the planarized $SiO_2$ layer wherein the thickness of said planar layer structure is set by selectively depositing said additional layer.

14. The method of claim 13 further comprising the step of:

forming an insulating layer between a plurality of wiring levels with the planar layer structure.

15. The method of claim 14 wherein said additional layer is composed of phosphorus silicate glass allowing growth in the planarizing deposition onto a next wiring level at a rate greater than a rate on the $SiO_2$ layer alone.

* * * * *